United States Patent
Rosenberg et al.

(10) Patent No.: US 10,148,063 B2
(45) Date of Patent: Dec. 4, 2018

(54) THERMALLY CONDUCTIVE AND ELECTRICALLY INSULATING INTERPOSER HAVING ACTIVE OPTICAL DEVICE MOUNTED THEREON

(71) Applicant: HEWLETT-PACKARD DEVELOPMENT COMPANY, L.P., Houston, TX (US)

(72) Inventors: Paul Kessler Rosenberg, Sunnyvale, CA (US); Michael Renne Ty Tan, Menlo Park, CA (US); Sagi Varghese Mathai, Sunnyvale, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 205 days.

(21) Appl. No.: 15/107,486

(22) PCT Filed: Jan. 31, 2014

(86) PCT No.: PCT/US2014/014015
§ 371 (c)(1),
(2) Date: Jun. 23, 2016

(87) PCT Pub. No.: WO2015/116130
PCT Pub. Date: Aug. 6, 2015

(65) Prior Publication Data
US 2016/0315448 A1 Oct. 27, 2016

(51) Int. Cl.
*H01L 23/36* (2006.01)
*H01S 5/024* (2006.01)
(Continued)

(52) U.S. Cl.
CPC ...... *H01S 5/02476* (2013.01); *H01L 23/3672* (2013.01); *H01L 23/3675* (2013.01);
(Continued)

(58) Field of Classification Search
CPC ............... H01S 5/02476; H01S 5/4025; H01S 5/02248; H01S 5/02469; H01L 23/49827;
(Continued)

(56) References Cited

U.S. PATENT DOCUMENTS 6,084,895 A 7/2000 Kouchi et al.
6,580,611 B1 6/2003 Vandentop et al.
(Continued)

FOREIGN PATENT DOCUMENTS

JP H0964478 A 3/1997

OTHER PUBLICATIONS

Bockstaele, R. et al., A Scalable Parallel Optical Interconnect Family, Apr. 2004, IO Overview Paper (Research Paper), 10 pages.
International Search Report & Written Opinion, dated Oct. 29, 2014, PCT Patent Application No. PCT/US2014/014015, 11 pages.

*Primary Examiner* — Tony Ko
(74) *Attorney, Agent, or Firm* — Tarolli, Sundheim, Covell & Tummino L.L.P.

(57) ABSTRACT

A device can include an active optical device (AOD) to at least one of transmit and receive optical signals. The device can also include an interposer having the AOD mounted thereon. The interposer can be in thermal contact with a heat sink and the interposer is mounted on a substrate. The interposer can be formed of a thermally conductive and electrically insulating material. The interposer can include a via to electrically couple the AOD to another electrical device.

13 Claims, 6 Drawing Sheets

(51) Int. Cl.
   *H01L 23/367* (2006.01)
   *H01L 23/498* (2006.01)
   *H01S 5/022* (2006.01)
   *H01S 5/40* (2006.01)

(52) U.S. Cl.
   CPC .. *H01L 23/49805* (2013.01); *H01L 23/49827* (2013.01); *H01S 5/02248* (2013.01); *H01S 5/02469* (2013.01); *H01S 5/4025* (2013.01); *H01L 2224/06181* (2013.01); *H01L 2224/33181* (2013.01)

(58) Field of Classification Search
   CPC ........... H01L 23/49805; H01L 23/3672; H01L 23/3675; H01L 2224/06181; H01L 2224/33181
   See application file for complete search history.

(56) References Cited

U.S. PATENT DOCUMENTS

| | | |
|---|---|---|
| 6,965,552 B2 | 11/2005 | Tokuda et al. |
| 7,217,955 B2 | 5/2007 | Hamaoka et al. |
| 7,319,217 B2 * | 1/2008 | Yoshihara ......... H01L 27/14618 250/208.1 |
| 2011/0306168 A1 | 12/2011 | Pendse et al. |
| 2012/0300402 A1 | 11/2012 | Vos |
| 2013/0016477 A1 | 1/2013 | Yokoya et al. |
| 2013/0195134 A1 | 8/2013 | Okahisa |
| 2014/0029639 A1 | 1/2014 | Zarbock et al. |
| 2017/0005453 A1 * | 1/2017 | Yim ................... H01L 31/0232 |

* cited by examiner

THERMALLY CONDUCTIVE AND ELECTRICALLY INSULATING INTERPOSER HAVING ACTIVE OPTICAL DEVICE MOUNTED THEREON

BACKGROUND

A system on a chip (SoC or SOC) is an integrated circuit (IC) chip that integrates components of a computer or other electronic system into a single chip. The SoC can contain digital, analog, mixed-signal, and/or radio-frequency functions on a single IC chip substrate. SoCs can be employed, for example, to implement embedded systems.

A system on a package (SoP) or system-in-a-package (SiP), also known as a Chip Stack multiple chip module (MCM), can be implemented as a number of IC chips enclosed in a single module (package). The SoP can perform most or all of the functions of an electronic system. An SoP can be employed in devices such as a mobile phone, a digital music player, etc. Dies containing IC chips, may be stacked vertically on a substrate. The IC chips can be internally connected by fine wires that are bonded to the package. Alternatively, with a flip chip technology, solder bumps can be employed to interconnect IC chips together through horizontal connections in a single circuit board (2.5D interconnect), or in a vertically stacked configuration (3D interconnect).

DETAILED DESCRIPTION

An active optical device (AOD) (e.g., a laser and/or a photodiode) can exhibit improved performance characteristics and/or improved longevity when operated at reduced temperature. Moreover, in some systems, such as a system on a chip (SoC) or a system of a package (SoP), the AOD can be located in close proximity (e.g., within 1-10 millimeters) of an integrated circuit (IC) chip that can dissipate a significant amount of heat when mounted on a substrate. To minimize the AOD operating temperature, the AOD can be mounted on a thermally conductive interposer positioned between the AOD and the substrate such that heat generated by the AOD is drawn away from the AOD and toward a lower temperature reservoir (e.g., moving air, liquid, a cold plate, a heat sink or a combination thereof).

Figure 1:
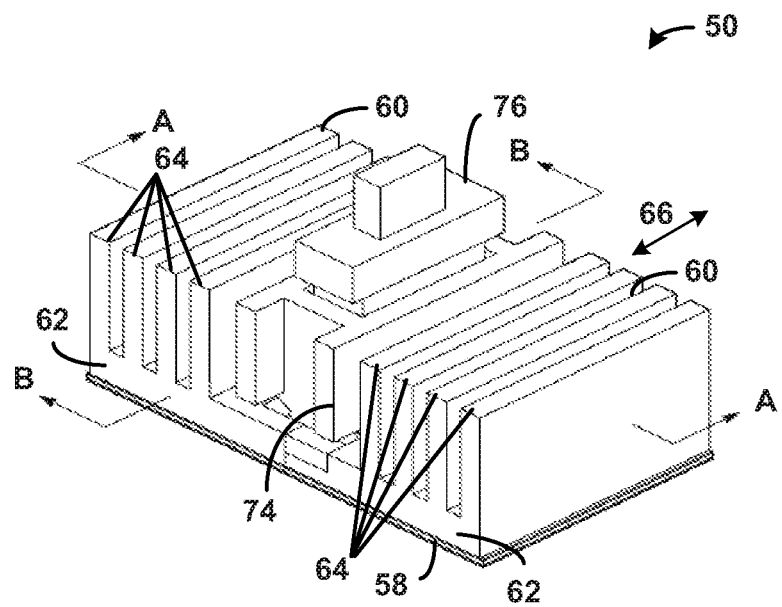
FIG. 1 illustrates an example of a system to facilitate thermal transfer.
Figure 2:
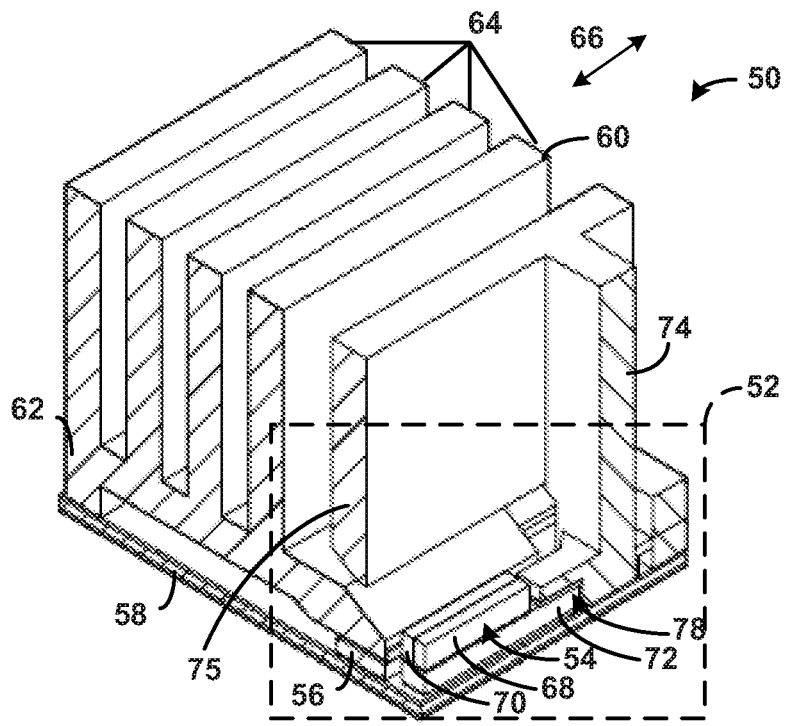
FIG. 2 illustrates a cross sectional view of the system illustrated in FIG. 1.
Figure 3:
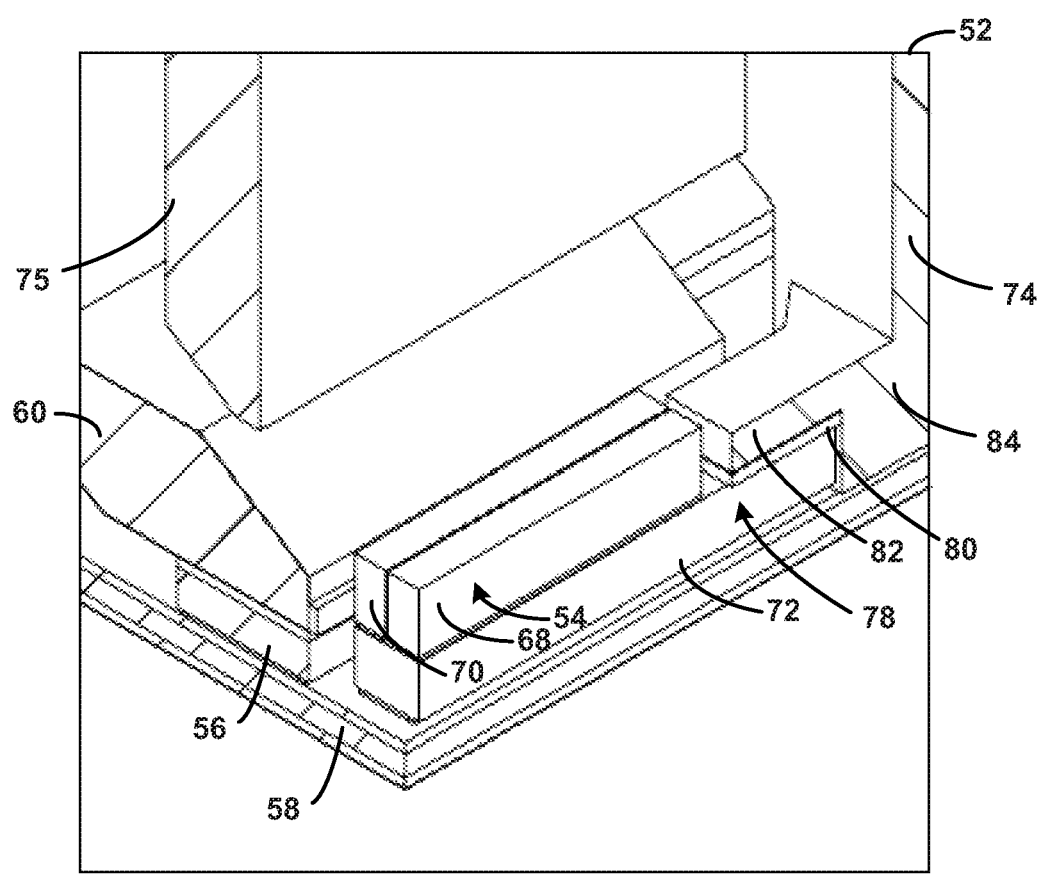
FIG. 3 illustrates an enlargement of the system illustrated in FIG. 2.

FIG. 1 illustrates an example of a system 50 to facilitate thermal transfer. The system 50 can be employed to implement an AOD 54 in close proximity to an IC chip 56 (the IC chip 56 is hidden from view in FIG. 1). FIG. 2 illustrates a cross sectional view of the system 50 of FIG. 1 taken along lines A-A and B-B of FIG. 1. FIG. 3 illustrates an enlarged view of FIG. 2 taken about the box indicated at 52. For purposes of simplification of explanation, the same reference numbers are employed in FIGS. 1-3 to denote the same structure.

The IC chip 56 can be, for example, a processor, an application specific integrated circuit (ASIC) chip, a field programmable gate array (FPGA), etc. The IC chip 56 can be implemented on a die. The IC chip 56 can overlay a substrate 58, which can be formed from a printed circuit board (PCB), a wafer, etc. In some examples, the substrate 58 can incorporate a dielectric material such as FR4 or aluminum oxide (alumina) that has a low thermal conductivity. Moreover, in some examples, multiple instances of the IC chip 56 (implemented on multiple dies) that overlay the substrate 58 can be implemented on the system 50. In such a situation, the system 50 could be implemented, for example, as a system on a package (SoP) a system on a chip (SoC), a circuit with surface mounted components, etc.

Each IC chip 56 can be thermally coupled to an IC heat sink 60 of the system 50. In some examples, multiple instances of the IC heat sink 60 can be included to thermally contact each of the plurality of IC chips 56. The IC heat sink 60 can be implemented, for example, with a thermally conductive material, such as copper. In some examples, the IC heat sink 60 can also be electrically conductive. The IC heat sink 60 can be formed, for example, from a base section 62 that is formed, for example, as a rectangular prism. The IC heat sink 60 can also include a plurality of fins 64 that extend in a perpendicular direction from the base section 62. Each fin 64 can also be formed as a rectangular prism, and each fin 64 can be substantially parallel to the other fins 64. Additionally, each fin 64 can also be spaced apart from the other fins 64, such that the system 50 can facilitate air flow (e.g., by a fan) in a directions indicated by the arrows 66. In other examples, the IC heat sink 60 can incorporate vertical pins, in place of some (or all) of the fins 64 shown, in order to work with airflow from various directions. The IC heat sink 60 can be adhered to the IC chip 56 through a thermal interface material (TIM), such as thermal grease, phase change material, aluminum oxide, zinc oxide, etc. Accordingly, the IC heat sink 60 can facilitate heat dissipation of the IC chip 56 (or IC chips 56) of the system 50.

The AOD 54 of the system 50 can be included to communicate through an optical channel (e.g., a fiber optic cable). The AOD 54 could be implemented, for example, as an optical transceiver device. The AOD 54 can include a photodiode 68 and/or a laser diode 70. In some examples, laser diode can be implemented as a vertical-cavity surface-emitting laser (VCSEL). Moreover, in some examples, the AOD 54 can include an array of photodiodes 68 and/or an array of laser diodes 70. The AOD 54 can be electrically coupled to the IC chip 56, in a manner described herein. Moreover, in some examples, such as wherein the AOD 54 is implemented as an array of photodiodes 68 and/or laser diodes 70, different portions of the AOD 54 (e.g., different subsets of the array of photodiodes 68 and/or laser diodes 70) can be electrically coupled to a single multi-channel drive or receive IC chip 56, or to multiple discrete IC chips 56 with one or more receive/transmit channels in the system 50.

The AOD 54 can overlay an interposer 72 that can be mounted on the substrate 58. The interposer 72 can be mounted on the substrate 58 in a manner similar to other surface mount components (e.g., soldering). The interposer 72 can be implemented as an electrical interface routing between the AOD 54 and the substrate 58. In the present example, the interposer 72 can be formed from an electrically isolating and thermally conductive material, such as silicon, ceramic (e.g., aluminum nitride (AlN)), etc. The interposer 72 can include vias extending there through to electrically couple the IC chip 56 (via traces on the substrate 58) to the AOD 54. The interposer 72 can have a footprint (e.g., surface area) larger than the AOD 54 and smaller than the substrate 58. In the present examples, the interposer 72 can operate as a substrate (e.g., an interposer substrate) of an interposer assembly that includes the AOD 54 mounted on the interposer 72.

In some examples, the interposer 72 can be shaped as a rectangular prism. Additionally, the interposer 72 can be thermally coupled to a thermally isolated heat sink 74. The thermally isolated heat sink 74 can be thermally isolated from the IC heat sink 60. The thermally isolated heat sink 74 can be formed from a thermally conductive material, such as copper. The interposer 72 can have a length of about 300 micrometers (μm) or more. In some examples, the interposer 72 can be mounted within less than one millimeter to several millimeters (mm; e.g., about 0.5 mm to about 10 mm) of the IC chip 56. In some examples, the thermally isolated heat sink 74 can be nearly completely thermally isolated from the IC heat sink 60, such as examples where separate heat sinks are employed as the thermally isolated heat sink 74 and the IC heat sink 60. In other examples, the thermally isolated heat sink 74 can be only partially thermally isolated from the IC heat sink 60, such as examples where a slot is cut into a heat sink to form the IC heat sink 60 and the thermally isolated heat sink 74.

The thermally isolated heat sink 74 can form a receptacle for housing and aligning an optical ferrule 76 (e.g., a fiber optical connector). That is, a portion of the thermally isolated heat sink 74 (e.g., a center portion) can be shaped to mate with the optical ferrule 76. In the system 50, the optical ferrule 76 is illustrated as having a rectangular shape, but in other examples, the optical ferrule 76 could be other shapes (e.g., round). As noted, the thermally isolated heat sink 74 can house the optical ferrule 76, such that the optical ferrule 76 can be aligned with the AOD 54 to facilitate optical communication between the optical channel (coupled to the optical ferrule 76) and the AOD 54. Additionally, the thermally isolated heat sink 74 can have sidewalls 75 extending parallel to the fins 64 of the IC heat sink 60. In this manner, the thermally isolated heat sink 74 and the IC heat sink 60 can facilitate airflow in the directions indicated by the arrows 66.

In some examples, the thermally isolated heat sink 74 can be formed integrally with the interposer 72. However, in other examples, the thermally isolated heat sink 74 and the interposer 72 can be coupled at a thermal interface 78. For instance, the interposer 72 and the thermally isolated heat sink 74 can be adhered together with a TIM 80. The thermal interface 78 can be formed with a portion of the thermally isolated heat sink 74, such as a cantilever 82 that extends from a base portion 84 of the thermally isolated heat sink 74 and overlays and abuts a portion of the interposer 72. In some examples, different configurations can be implemented for the thermal interface 78, such as finger joints, dovetail joints, etc. In some examples, the thermally isolated heat sink 74 may contact a sidewall of the AOD 54, and in other examples, the thermally isolated heat sink 74 can be spaced apart from the AOD 54. The thermally isolated heat sink 74 can be positioned to avoid direct contact with any portion of the IC heat sink 60, to avoid incidental thermal transfer of heat generated by the IC chip 56.

The AOD 54 can generate heat by dissipating electrical power while transmitting optical signals and/or by receiving optical signals. As noted, the interposer 72 is formed of a thermally conductive material, and the interposer 72 is thermally coupled to the thermally isolated heat sink 74. In this manner, heat generated by the AOD 54 can be rapidly dissipated through the thermally isolated heat sink 74. Moreover, heat generated by the IC chip 56 is dissipated through the IC heat sink 60. Since the IC heat sink 60 and the thermally isolated heat sink 74 are in fact, thermally isolated, the heat generated by the IC chip 56 does not substantially increase the temperature of the AOD 54. Thus, by employing the system 50, a localized cooling system that includes the interposer 72 and the thermally isolated heat sink 74 can be included for the AOD 54. The localized cooling system can ensure that the operating temperature of the AOD 54 is maintained at or below a desired level. Moreover, by changing the air flow rate (in the direction indicated by the arrows 66), the operating temperature of the AOD 54 can be even further reduced. In this manner, the interposer 72 can facilitate a reduction of an aggregate thermal resistance between the AOD 54 and ambient air into which heat generated by the AOD 54 and the IC chip 56 is transferred. Such a reduction of thermal resistance can extend the operational life of the AOD 54 (e.g., by a factor of about 2× for every 10° C. temperature reduction).

Figure 4:
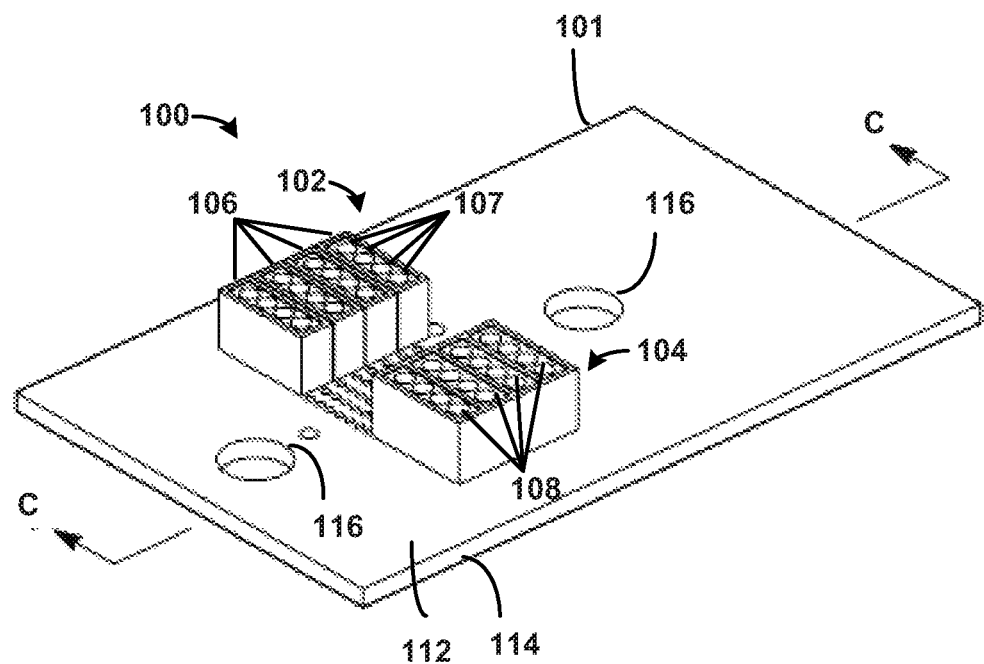
FIG. 4 illustrates an example of an interposer to facilitate thermal transfer.

FIG. 4 illustrates an example of an interposer assembly 100. The interposer assembly 100 can include, for example, an interposer substrate 101 that could be employed, for example, as the interposer 72 (which is a substrate of an interposer assembly) illustrated in FIG. 1. The interposer assembly 100 can include an AOD, such as the AOD 54 of FIG. 1 disposed on the interposer substrate 101. The interposer substrate 101 can be formed, for example, from a thermally conductive and electrically insulating material, such as silicon, ceramic, etc. The interposer assembly 100 can be mounted on a substrate, such as a PCB that has a larger footprint (e.g., surface area) than the interposer assembly 100.

The AOD can include, for example, a group of arrays of lasers 102 (e.g., VCSELs) and an array of photodiodes 104. In some examples, the group of arrays of lasers 102 can be formed with multiple blocks (4 shown in FIG. 4) that each include a laser array 106 that includes multiple (4 shown in FIG. 4) individual lasers 107. Additionally, the array of photodiodes 104 can be a single monolithic block. Additionally, in the example illustrated, there are 16 lasers 107 and 16 photodiodes 108 illustrated, but there can be an almost unlimited number of lasers 107 or photodiodes 108 that can vary based on the nature of the environment of application. In some examples, the AOD could be implemented solely as an optical transmitter or an optical receiver, such that the group of arrays of lasers 102 or the array of photodiodes 104 could be omitted. In some examples, each laser array 106 of the group of arrays of lasers 102 can be configured to output light at the same wavelength and arranged in a time division multiple access (TDMA) configuration. Alternatively, each laser array 106 of the group of arrays of lasers 102 can be configured to output light at different wavelengths and the group of arrays of lasers 102 can be arranged in a wave division multiple access (WDMA) configuration. The AOD (the group of arrays of lasers 102 and the array of photodiodes 104) can have a smaller footprint (e.g., surface area) than the interposer substrate 101, such that edges of the AOD lie within boundaries of edges of the interposer substrate 101.

The group of arrays of lasers 102 and the array of photodiodes 104 can be attached to the interposer substrate 101 of the interposer assembly 100 by the employment of flip-chip techniques or a similar process. The group of arrays of lasers 102 and the array of photodiodes 104 can be electrically coupled to IC chips, such as the IC chip 56 illustrated in FIG. 1. In some examples, a subset of the group of the arrays of lasers 102 and a subset of the array of photodiodes 104 can be electrically coupled to a given IC chip. For example, a given one of the lasers 107 contained in one laser array 106 of the group of arrays of lasers 102 and a photodiode 108 of the array of photodiodes 104 could be electrically coupled to the given IC chip, thereby providing optical transmitting and receiving capabilities to the given IC chip.

Figure 5:
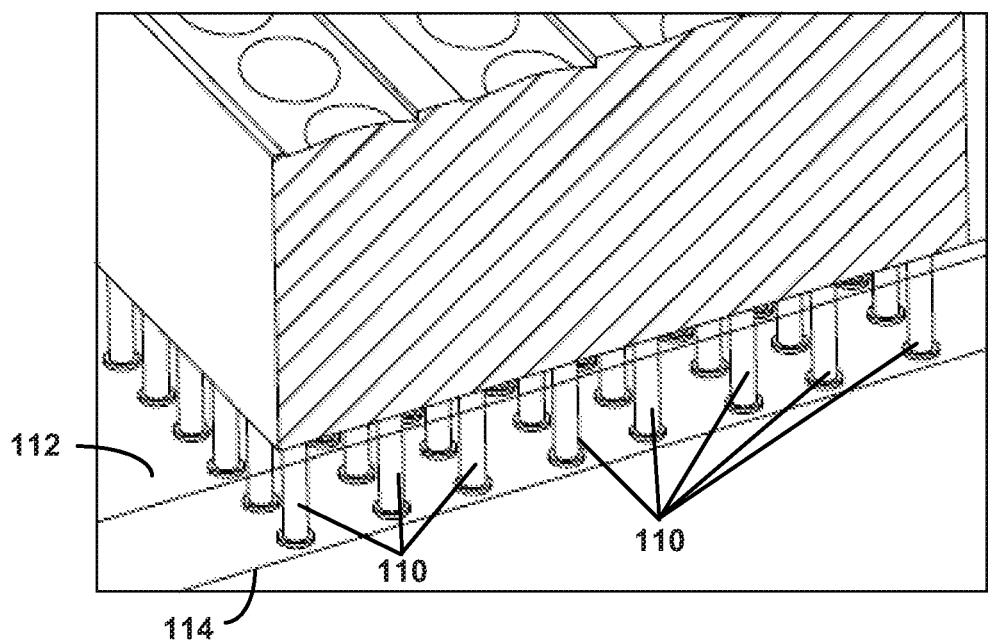
FIG. 5 illustrates a cross-sectional view of a detail from the interposer of FIG. 4.

FIG. 5 illustrates a cross sectional view of the interposer assembly 100 taken along line C-C of FIG. 4. For purposes of simplification of explanation, FIGS. 4 and 5 employ the same reference numbers to denote the same structure. The interposer assembly 100 can include a plurality of vias 110 to provide electrical conduction between the substrate and the array of photodiodes 104 and the group of arrays of lasers 102. The plurality of vias 110 allow for electrical contacts on a given side 112 of the interposer substrate 101 of the interposer assembly 100 to be passed through to an opposing side 114 of the interposer substrate 101. The plurality of vias 110 can be formed, for example, by etching, micro-drilling, and deposition of conductive material such as Cu, or other standard manufacturing techniques. The plurality of vias 110 can provide an electrically conducting conduit through the interposer substrate 101 of the interposer assembly 100. The plurality of vias 110 can be electrically coupled to traces on the substrate, which traces can be electrically coupled to the given IC chip.

Figure 6:
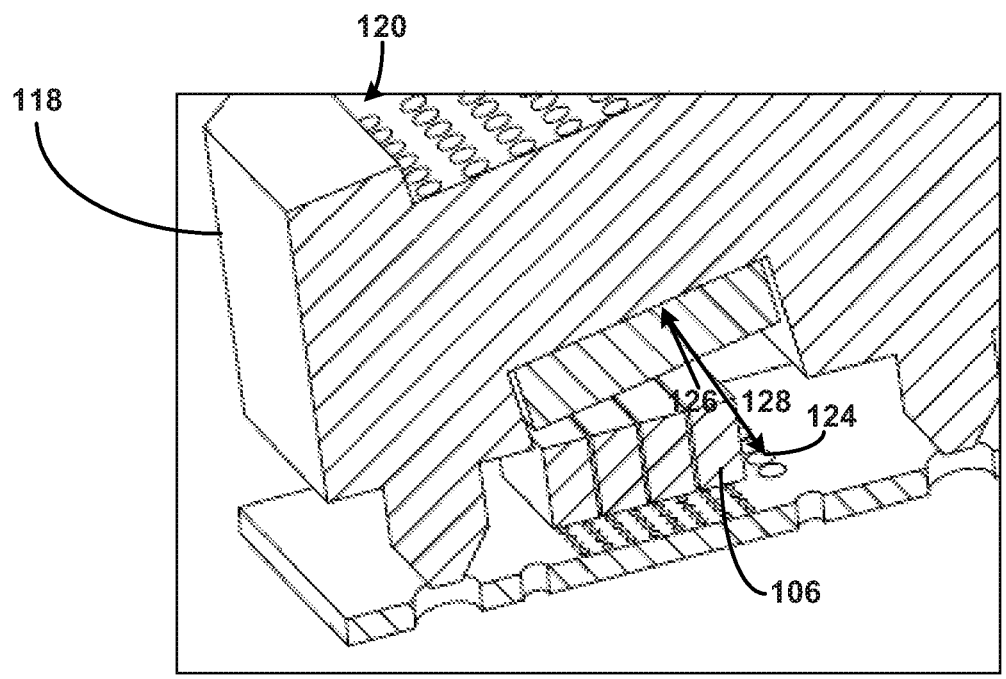
FIG. 6 illustrates a cross sectional view of the interposer of FIG. 4 with an optical guide attached thereon.
Figure 7:
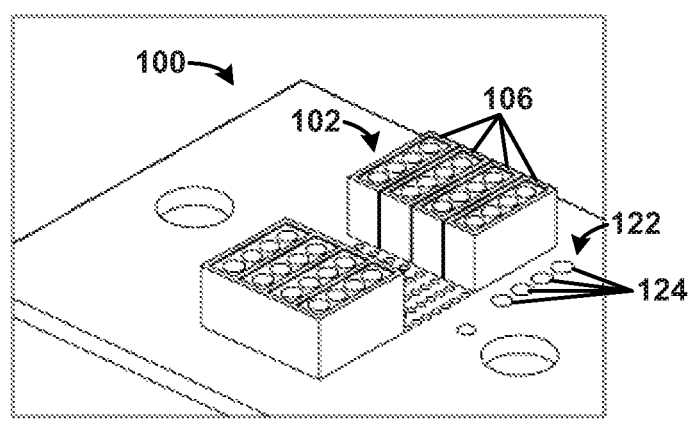
FIG. 7 illustrates another view of the interposer illustrated in FIG. 4.

Referring back to FIG. 4, the interposer substrate 101 can include reference features for alignment, such as optical fiducial marks of receptacles 116 to facilitate mounting and aligning an optical guide that can be coupled to an optical ferrule (e.g., the optical ferrule 76 illustrated in FIG. 1). The receptacles 116 can be implemented, for example, as through-holes that are configured to receive pegs or other mechanical fasteners of the optical guide. FIG. 6 illustrates an example of a cross sectional view of the interposer assembly 100 of FIG. 4 with the addition of an optical guide 118 taken along line C-C of FIG. 1 wherein the optical guide 118 is being affixed thereon. FIG. 7 illustrates another view of the interposer assembly 100 illustrated in FIG. 4. For purposes of simplification of explanation, the same reference numbers are employed in FIGS. 4, 6 and 7 to denote the same structure.

The optical guide 118 can include a plurality of optical channels or pathways configured to guide (e.g., align) optical signals transmitted by a laser array 106 of the group of arrays of lasers 102 to an optical fiber contained within an optical ferrule (e.g., the optical ferrule 76 of FIG. 1). The plurality of optical channels can also be configured to guide optical signals received from fibers contained within the optical ferrule to corresponding photodiodes of the array of photodiodes 104. In some examples, the optical guide 118 can be formed of a transparent material with a known index of refraction, such as glass. The optical guide 118 can be shaped to receive an optical ferrule (e.g., the optical ferrule 76 of FIG. 1). In some examples, the optical guide 118 can include a recessed portion 120 configured to align the optical ferrule relative to the optical guide 118.

In examples where the interposer substrate 101 is implemented as a semiconductor material (e.g., silicon), additional semiconductor components can be embedded in the interposer substrate 101 of the interposer assembly 100 For instance, the interposer substrate 101 can have an array of monitor photodiodes 122 embedded in the interposer substrate 101 of the interposer assembly 100. Each monitor photodiode 124 of the array of monitor photodiodes 122 can be a semiconductor component that is configured to receive a relatively small portion (e.g., about 1-5%) of an optical signal transmitted by a laser array 106 of the group of arrays of lasers 102. For instance, the optical guide 118 can be configured such that a portion of light (e.g., about 1-5%) transmitted by a laser array 106 in a direction indicated by the arrow 126 is scattered or reflected off a surface of the optical guide 118 in another direction indicated by the arrow 128 and that portion of the optical signal is received at a given monitoring photodiode 124. In response, the given monitoring photodiode 124 can provide a monitor signal that characterizes a power level and quality of the signal transmitted by the laser array 106. The monitor signal can be provided to a corresponding IC chip through the substrate. Additionally or alternatively, in some examples, the interposer assembly 100 can include an array of amplifiers also indicated at 124, such as transimpedance amplifiers (TIA) embedded in the interposer substrate 101. In such a situation, the array of transimpedance amplifiers could be configured to boost an electrical signal output by the photodiodes 108, thereby reducing the sensitivity of the photodiodes 108 to electrical noise.

The interposer substrate 101 of the interposer assembly 100 can provide a path with reduced thermal resistance to a lower temperature reservoir, such as moving air, liquid, a cold plate, etc. For instance, as described with respect to FIG. 1, the interposer substrate 101 can be in thermal contact with a heat sink, such as the thermally isolated heat sink 74 of FIG. 1. By configuring the interposer substrate 101 in this manner, heat generated by the group of arrays of lasers 102 and/or the array of photodiodes 104 can be transferred to and dissipated through the heat sink. Accordingly, the heat generated by the group of arrays of lasers 102 and/or the array of photodiodes 104 is drawn away from the lasers 107 within the group of the arrays of lasers 102 and the photodiodes 108 of the array of photodiodes 104, thereby reducing and/or eliminating heat transfer to the substrate.

Figure 8:
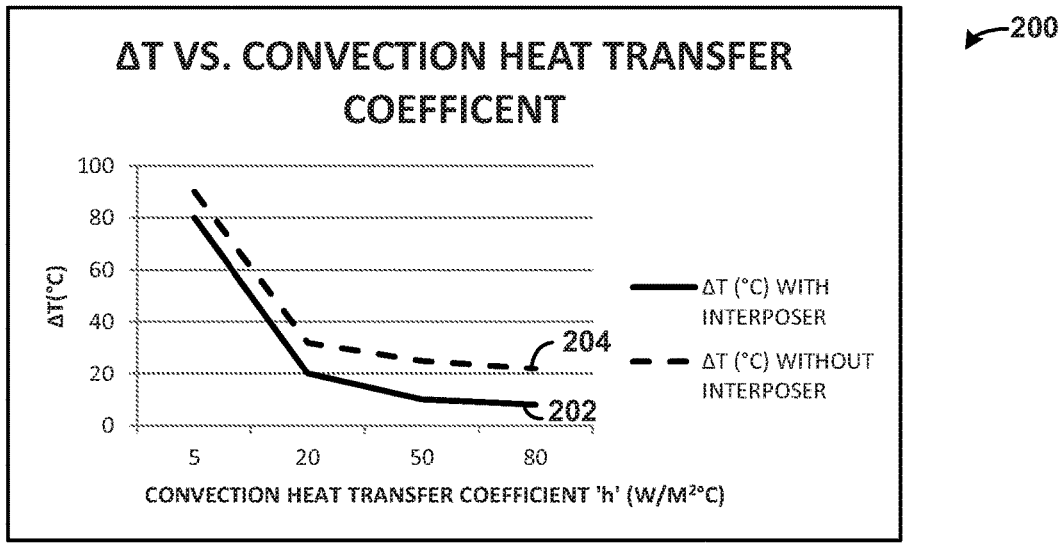
FIG. 8 illustrates a graph that illustrates a comparison of system temperature for systems with and without an interposer as a function of a convection heat transfer coefficient.

FIG. 8 illustrates a graph 200 that plots a comparison of a change in temperature in degrees Celsius ($\Delta°$ C.) at a hottest point of an AOD (e.g., the AOD 54 of FIG. 1) relative to a coolest point on a thermally isolated heat sink (e.g., the thermally isolated heat sink 74 of FIG. 1) as a function of a convection heat transfer coefficient, which can also be referred to as a convection film coefficient ('h') for a system that includes an interposer and a system that operates without the interposer. Thus, the graph 200 includes two different plots, a first plot 202 for the AOD 54 employed in the system 50 of FIG. 1 wherein the AOD 54 overlays the interposer 72 and a second plot 204, with a configuration such that the AOD is mounted directly on a substrate (e.g., a PCB) and the interposer is omitted. The convection heat transfer coefficient can be measured in Watts per square meter-degrees Celsius (W/m2° C.). The convection heat transfer coefficient can increase as a function of air speed (such as air flowing in the directions indicated by the arrows 66 illustrated in FIG. 1). As is illustrated, the change in temperature decreases as convection heat transfer coefficient increases. As illustrated by plot 202 compared to a system that omits the interposer 72 of FIG. 1 (plot 204), such that the AOD is mounted directly on the substrate 58 of FIG. 1, the change in temperature of the system is about 10 degrees Celsius (Δ° C.) less if the interposer is included. Accordingly, by employing the interposer an expected lifetime of the AOD can be increased by a factor of about 2. Thus, as illustrated in the graph 200, independent of the convection heat transfer coefficient (which corresponds to how fast air is moving), inclusion of the interposer provides a reduction of about 10° C. or more.

Figure 9:
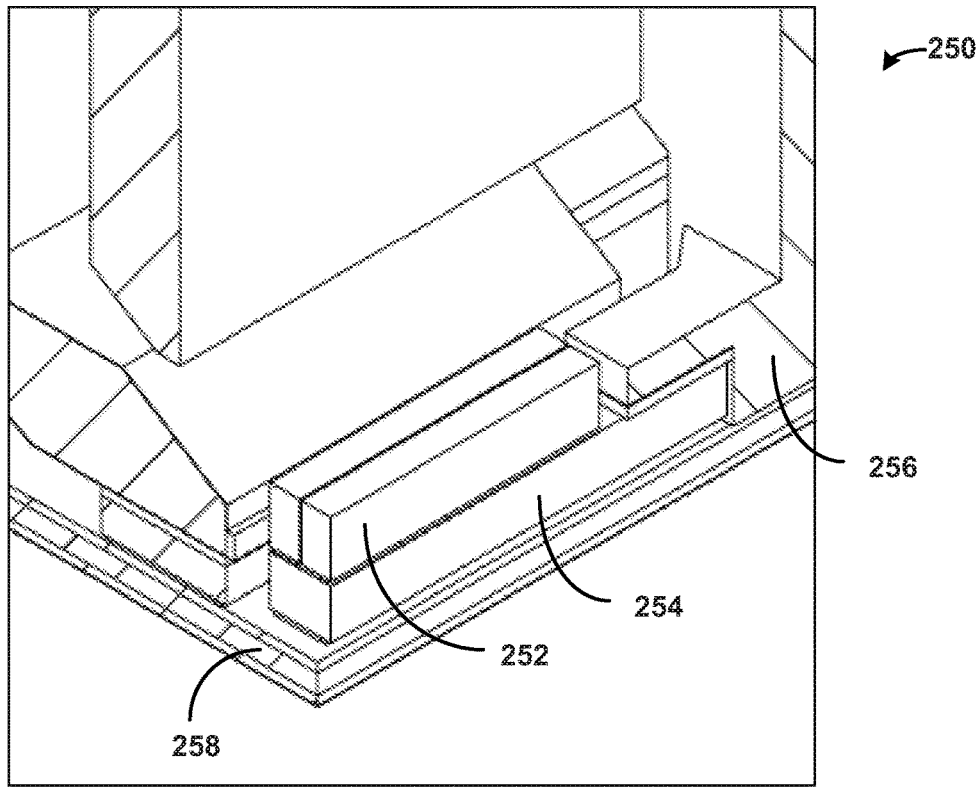
FIG. 9 illustrates an example of a device to facilitate thermal transfer.

FIG. 9 illustrates an example of a device 250 to facilitate thermal transfer. The device 250 can include an AOD 252 to at least one of transmit and receive optical signals. The device 252 can also include an interposer 254 having the AOD 252 mounted thereon. The interposer 254 can be in thermal contact with a heat sink 256 and the interposer 254 can be mounted on a substrate 258. The interposer 254 can be formed of a thermally conductive and electrically insulating material. The interposer 254 can include a via (embedded therein) to electrically couple the AOD 252 to another electrical device.

Figure 10:
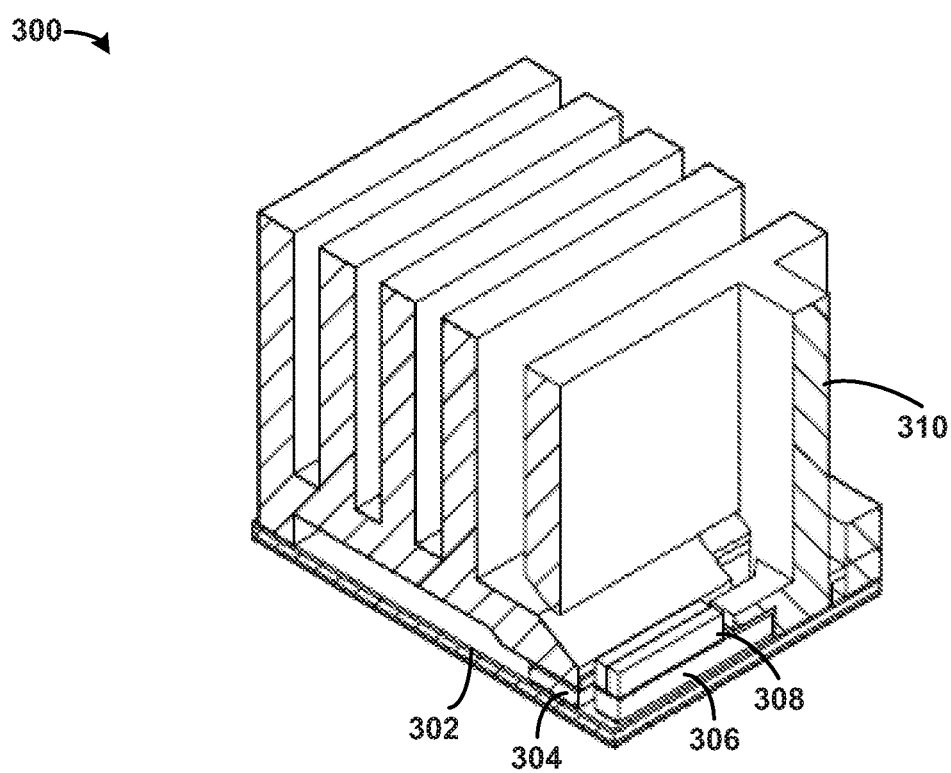
FIG. 10 illustrates another example of a system to facilitate thermal transfer.

FIG. 10 illustrates another example of system 300 to facilitate thermal heat transfer. The system 300 can include a substrate 302 with a plurality of integrated circuit (IC) chips 304 mounted thereon. The system 300 can also include an interposer 306 mounted on the substrate 302. The interposer 306 can be thermally conductive and primarily electrically insulating. The system 300 can include an AOD 308 mounted on the interposer 306. The system 300 can further include a heat sink 310 thermally coupled to the interposer 306. The interposer 306 can transfer heat generated by the AOD 308 to the heat sink 310.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A device comprising:
   an active optical device (AOD) to at least one of transmit and receive optical signals; and
   an interposer having the AOD mounted thereon, wherein the interposer is in thermal contact with a heat sink and the interposer is mounted on a substrate, wherein the interposer is formed of a thermally conductive and primarily electrically insulating material and the interposer includes a via to electrically couple the AOD to another electrical device, wherein:
   the interposer is to transfer heat generated by the AOD to the heat sink,
   the AOD comprises an array of lasers, and
   the interposer comprises a plurality of vias to couple each laser of the array of lasers to a conductive trace that is conductively coupled an associated integrated circuit (IC) chip that is mounted on the substrate.

2. The device of claim 1, wherein the heat sink is thermally isolated from another heat sink thermally coupled to the IC chip.

3. The device of claim 1, wherein the heat sink is shaped to house an optical ferrule.

4. The device of claim 3, wherein the heat sink is shaped to allow air flow along parallel sides of the heat sink.

5. The device of claim 1, further comprising a monitor photodiode embedded in the interposer, wherein the monitor diode is to provide a monitor signal characterizing signal strength of an optical signal transmitted by the AOD.

6. The device of claim 5, further comprising an optical guide aligned with respect to features on the interposer, wherein the optical guide is to:
   guide the optical signal transmitted by the AOD to an optical ferrule; and
   provide a portion of the optical signal to the monitor photodiode.

7. A device comprising:
   an active optical device (AOD) to at least one of transmit and receive optical signals; and
   an interposer having the AOD mounted thereon, wherein the interposer is in thermal contact with a heat sink and the interposer is mounted on a substrate, wherein the interposer is formed of a thermally conductive and primarily electrically insulating material and the interposer includes a via to electrically couple the AOD to another electrical device,
   wherein the AOD comprises a plurality of photodiodes, and the device further comprises a transimpedance amplifier (TIA) embedded in the interposer, wherein the TIA is to amplify a signal output by the photodiodes.

8. A system comprising:
   a substrate with a plurality of integrated circuit (IC) chips mounted thereon;
   an interposer mounted on the substrate, wherein the interposer is thermally conductive and primarily electrically insulating;
   an active optical device (AOD) mounted on the interposer; and
   a heat sink thermally coupled to the interposer;
   wherein the interposer is to transfer heat generated by the AOD to the heat sink, and wherein the heat sink is a given heat sink, the system further comprising another heat sink thermally coupled to the IC chips, wherein the given heat sink is thermally isolated from the another heat sink.

9. The system of claim 8, wherein the another heat sink comprises a plurality of fins to allow airflow in a given direction and wherein the given heat sink is shaped to include sidewalls that extend parallel to the plurality of fins.

10. A system comprising:
    a substrate with a plurality of integrated circuit (IC) chips mounted thereon;
    a given heat sink thermally coupled to the plurality of IC chips;
    an interposer mounted on the substrate, wherein the interposer is thermally conductive and primarily electrically insulating and the interposer is shaped to house an optical ferrule;
    an active optical device (AOD) mounted on the interposer, the AOD comprising a an array of lasers and an array of photodiodes, wherein the AOD has a smaller footprint than the interposer; and another heat sink thermally coupled to the interposer, wherein the another heat sink is thermally isolated from the given heat sink;

wherein the interposer is to transfer heat generated by the AOD to the other heat sink and the interposer comprises:

a plurality of vias coupled to the AOD, wherein the plurality of vias electrically couple the array of lasers and the array of photodiodes to the plurality of IC chips; and a plurality of monitor photodiodes, wherein each of the plurality of monitor photodiodes is to provide a monitor signal that characterizes a strength of an optical signal generated by a corresponding laser of the array of lasers of the AOD.

11. The system of claim 10, wherein the given heat sink comprises a plurality of parallel fins that allow air flow in a given direction and the other heat sink comprises sidewalls extending parallel to the plurality of parallel fins.

12. A device comprising:
an active optical device (AOD) to at least one of transmit and receive optical signals;
an interposer having the AOD mounted thereon, wherein the interposer is in thermal contact with a heat sink and the interposer is mounted on a substrate, wherein the interposer is formed of a thermally conductive and primarily electrically insulating material and the interposer includes a via to electrically couple the AOD to another electrical device; and
a monitor photodiode embedded in the interposer, wherein the monitor diode is to provide a monitor signal characterizing signal strength of an optical signal transmitted by the AOD.

13. The device of claim 12, further comprising an optical guide aligned with respect to features on the interposer, wherein the optical guide is to:
guide the optical signal transmitted by the AOD to an optical ferrule; and
provide a portion of the optical signal to the monitor photodiode.

* * * * *